United States Patent
Su et al.

(10) Patent No.: US 7,015,624 B1
(45) Date of Patent: Mar. 21, 2006

(54) NON-UNIFORM THICKNESS ELECTROACTIVE DEVICE

(75) Inventors: Ji Su, Highland Park, NJ (US);
Joycelyn S. Harrison, Hampton, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 733 days.

(21) Appl. No.: 09/696,526

(22) Filed: Oct. 23, 2000

Related U.S. Application Data (60) Provisional application No. 60/161,113, filed on Oct. 22, 1999.

(51) Int. Cl.
*H01L 41/08* (2006.01)
(52) U.S. Cl. .................. 310/328; 310/330; 310/367
(58) Field of Classification Search .......... 310/330, 310/331, 332, 367, 368, 328; H01L 41/08
See application file for complete search history.

(56) References Cited

U.S. PATENT DOCUMENTS

| | | | | |
|---|---|---|---|---|
| RE20,213 | E * | 12/1936 | Sawyer ............... | 310/331 |
| 2,308,360 | A * | 1/1943 | Fair ................... | 310/334 |
| 2,485,722 | A * | 10/1949 | Erwin ................. | 310/360 |
| 2,540,412 | A * | 2/1951 | Adler .................. | 310/330 |
| 2,745,034 | A * | 5/1956 | Simons ............... | 310/317 |
| 2,900,536 | A * | 8/1959 | Palo ................... | 310/330 |
| 3,058,015 | A * | 10/1962 | Nesh .................. | 181/207 |
| 3,168,623 | A * | 2/1965 | Petermann .......... | 310/330 |
| 3,179,823 | A * | 4/1965 | Nesh .................. | 310/319 |
| 3,442,570 | A * | 5/1969 | Picker ................. | 310/311 |
| 3,500,451 | A * | 3/1970 | Yando ................ | 310/330 |
| 3,676,722 | A * | 7/1972 | Schafft ............... | 310/332 |
| 3,781,955 | A * | 1/1974 | Lavrinenko et al. ... | 29/25.35 |
| 3,832,580 | A * | 8/1974 | Yamamuro et al. ... | 310/800 |
| 4,093,883 | A | 6/1978 | Yamamoto | |
| 4,322,877 | A * | 4/1982 | Taylor ................ | 29/25.35 |
| 4,399,385 | A * | 8/1983 | Osaka et al. ......... | 310/328 |

(Continued)

FOREIGN PATENT DOCUMENTS

DE        24 44647        8/1976

(Continued)

OTHER PUBLICATIONS

Pelrine et al, Electrostriction of Polymer Films for Microactuators, 1997 Micro Electro Mechanical Systems Proc., Jan. 1997, p. 238-43.*

(Continued)

*Primary Examiner*—Darren E. Schuberg
*Assistant Examiner*—Karen B. Addison
(74) *Attorney, Agent, or Firm*—Robin W. Edwards (57) ABSTRACT

An electroactive device comprises at least two layers of material, wherein at least one layer is an electroactive material and wherein at least one layer is of non-uniform thickness. The device can be produced in various sizes, ranging from large structural actuators to microscale or nanoscale devices. The applied voltage to the device in combination with the non-uniform thickness of at least one of the layers (electroactive and/or non-electroactive) controls the contour of the actuated device. The effective electric field is a mathematical function of the local layer thickness. Therefore, the local strain and the local bending/torsion curvature are also a mathematical function of the local thickness. Hence the thinnest portion of the actuator offers the largest bending and/or torsion response. Tailoring of the layer thicknesses can enable complex motions to be achieved.

35 Claims, 5 Drawing Sheets

U.S. PATENT DOCUMENTS

| | | | | |
|---|---|---|---|---|
| 4,399,386 A | * | 8/1983 | Osaka et al. | 310/321 |
| 4,399,986 A | * | 8/1983 | Collins | 266/272 |
| 4,400,634 A | * | 8/1983 | Micheron | 307/400 |
| 4,438,386 A | * | 3/1984 | Gyugyi | 323/210 |
| 4,438,441 A | * | 3/1984 | Bolmgren et al. | 310/330 |
| 4,457,636 A | * | 7/1984 | Nusser | 101/93.05 |
| 4,578,613 A | | 3/1986 | Posthuma de Boer et al. | |
| 4,814,659 A | | 3/1989 | Sawada | |
| 4,868,447 A | | 9/1989 | Lee et al. | |
| 5,440,320 A | | 8/1995 | Lach et al. | |
| 6,297,579 B1 | * | 10/2001 | Martin et al. | 310/330 |
| 6,545,391 B1 | * | 4/2003 | Su et al. | 310/332 |

FOREIGN PATENT DOCUMENTS

| | | |
|---|---|---|
| EP | 59121889 | 7/1984 |
| EP | 11238919 | 8/1999 |
| GB | 2 046 936 A | 4/1980 |
| GB | 2 327 927 A | 3/1998 |
| JP | 11-238919 | 8/1999 |

OTHER PUBLICATIONS

Y. Bar-Cohen et al, "NASA/JPL Workshop on Biomorphic Explorers for Future Missions", held at Jet Propulsion Labs, Pasadena, CA, Aug. 19-20, 1998, 22 pgs.

Y. Bar-Cohen et al, SPIE Proceedings, Newport Beach, CA, Paper No. 3669-05, 1999, 6 pgs.

Web page (http://members.aol.com/rhoadkyll2/scifeb1.text, Jul. 25, 2000, 2 pgs.

"Breakthroughs", Discover, vol. 19, No. 8, Aug. 1998, 2 pgs.

Y. Bar-Cohen et al., "Electroactive polymers (EAP) low mass musscle actuators", SPIE International Conference, Smart Structures and Materials Symposium, Enabling Technologies: Smart Structures and Integrated Systems, San Diego, CA Mar. 3-6, 1997, 6 pgs.

Y. Bar-Cohen et al., "Flexible, low mass robotic arm actuated by electroactive polymers", SPIE 5th Annual International Symposium on Smart Structures and Materials, Mar. 1-5, 1998, 5 pgs.

* cited by examiner

$t = f(\ell)$
$t = f(\omega)$
$t = f(\ell, \omega)$

FIG. 6

NON-UNIFORM THICKNESS ELECTROACTIVE DEVICE

CLAIM OF BENEFIT OF PROVISIONAL APPLICATION

Pursuant to 35 U.S.C. §119, the benefit of priority from provisional application 60/161,113, with a filing date of Oct. 22, 1999, is claimed for this non-provisional application.

ORIGIN OF THE INVENTION

The invention described herein was made by an employee of the United States Government and a National Research Council Research Associate and may be used by or for the Government for governmental purposes without the payment of any royalties thereon or therefor.

CROSS REFERENCE TO RELATED CASES

This application is related to co-pending, commonly owned patent application Ser. No. 09/696,524, filed Oct. 23, 2000, entitled "Polymer-Polymer Bilayer Actuator", co-pending commonly owned patent application Ser. No. 09/696,528, filed Oct. 23, 2000, entitled "Electrostrictive Graft Elastomers," and co-pending, commonly owned patent application Ser. No. 09/696,527, filed Oct. 23, 2000, entitled "Membrane Position Control."

BACKGROUND OF THE INVENTION

1. Field of the Invention

The present invention is generally related to the field of electroactive actuators. More specifically, it relates to an electroactive actuator having at least one layer of non-uniform thickness.

2. Description of the Related Art

Actuation devices are used for many applications, including aerospace, fluid flow and biomedical. Space applications include robotics, miniature rovers, and the shaping, tuning, positioning, controlling and deforming of membrane structures. Membrane inflatable and deployable space structures are used by the government and commercially as reflectors, antennas, solar arrays, satellites, solar sails, etc. Although actuation devices are widely used, many challenges exist which limit their performance for high precision applications. Factors affecting precision include surface smoothness, deviation from desired surface profile, surface deformations due to thermal fluctuations, and accurate membrane positioning. Additionally, hydrofoils and airfoils that can optimize their surface shape at varying flow rates are desirable to, for example, increase lift, reduce noise levels, lower vibrations and reduce drag. Other potential uses of actuation devices include precise positioning of display panels and optical index layers. To operate most effectively in the aforementioned applications, actuation devices require sufficient force and strain, and often need to produce complex motions that may include both bending and torsion.

Conventional piezoelectric ceramic, polymer, and composite actuators (including piezoelectric, electrostrictive, and electrostatic) lack the combination of sufficient strain and force to most effectively perform the aforementioned functions. Previous concepts for shaping and tuning membrane structures have primarily involved the use of piezoelectric ceramic materials. These ceramic piezoelectrics have the major problems of large mass, high density, low strain and high brittleness. Generally, piezoceramics also need additional mechanical devices to achieve a shaping, tuning, positioning, controlling or deforming function. In contrast to electroceramics, electroactive polymers are emerging as new actuation materials due to their enhanced strain capabilities.

Electrostrictive polymer-polymer actuators or other electroactive polymer actuators that provide enhanced strain capabilities can shape, tune, position, control and deform membrane structures, as well as perform in other applications, in ways not previously possible with other materials. An example of such an electrostrictive polymer-polymer actuator is described in the patent application entitled "Polymer-Polymer Bilayer Actuator", Ser. No. 09/696,524, filed Oct. 23, 2000, hereby incorporated by reference. The greater strain capability provides further possibilities for small-scale applications and integration into skin surfaces. The electroactive actuators can coincide with specific contours to optimize, for example, shapes for fluid flow, reflection and other membrane uses.

Existing devices capable of providing complex motion response utilize surface electrode patterning and/or polymer laminates having tailored lamina properties and orientations, such as described in U.S. Pat. No. 4,868,447. It is desirable to obtain complex motion response without requiring tailored surface electroding or laminate design.

STATEMENT OF THE INVENTION

Accordingly, an object of the present invention is to provide an electroactive device having controlled local strain and curvature.

Another object is to provide an electroactive device having a response contour which varies across the device.

Another object is to provide an electroactive device that can produce complex motions.

A further object is to provide an electroactive device with enhanced strain capabilities.

Additional objects and advantages of the present invention are apparent from the drawings and specification that follow.

SUMMARY OF THE INVENTION

In accordance with the present invention, the foregoing and other objects and advantages are attained by providing an electroactive device having at least two layers of material, wherein at least one layer is an electroactive material and wherein at least one layer is of non-uniform thickness. The device can be produced in various sizes, ranging from large structural actuators to microscale or nanoscale devices. The applied voltage to the device in combination with the non-uniform thickness of at least one of the layers (electroactive and/or non-electroactive) controls the contour of the actuated device. The effective electrical field is a mathematical function (E=V/D, where E is electrical field, V is voltage and D is thickness) of the local layer thickness. Therefore, the local strain and the local bending/torsion curvature are also a mathematical function of the local thickness. Hence the thinnest portion of the actuator offers the largest bending and/or torsion response. Tailoring of the layer thicknesses can enable complex motions to be achieved.

In a preferred embodiment, one or more electroactive layers of non-uniform thickness control the curvature of the device. The most responsive portions of the device will be at the thinnest portions of the electroactive layers, where the highest electric fields result. In other embodiments, the curvature can be controlled by varying the thickness of the non-electroactive layer or by varying the thickness of both the electroactive layer(s) and non-electroactive layer.

The electroactive device described herein will provide enabling technology to allow variable contouring of the device to expand electroactive actuator use in applications such as motion control, position control, tension control, curvature control, biomedical pulse control, surface flow dynamic control, display panels, optical alignment, optical filters, micro-electromechanical systems, and nano-electromechanical systems. More specifically, it can be utilized in membrane inflatable and deployable structures, and be used for shaping surfaces such as hydrofoils and airfoils to optimize shape for different flow rates. Furthermore, the device could serve to provide precise positioning of an optical index layer for a liquid crystal display and provide positioning control of display panels to reduce glare.

Advantages of using polymers for the electroactive layer(s) include low weight, unified materials-device body, simple operation, long lifetime, flexibility, toughness, and ease of processing. However, use of layers (electroactive and/or non-electroactive) of non-uniform thickness to control the curvature can be applied to any materials that can cooperatively produce a sufficient force and strain combination for particular shaping, tuning, positioning, controlling and deforming applications.

BRIEF DESCRIPTION OF THE DRAWINGS

A more complete appreciation of the invention and the many of the attendant advantages thereof will be readily attained as the same becomes better understood by reference to the following detailed description when considered in connection with the accompanying drawings, wherein.

DETAILED DESCRIPTION OF THE INVENTION

Figure 1A:
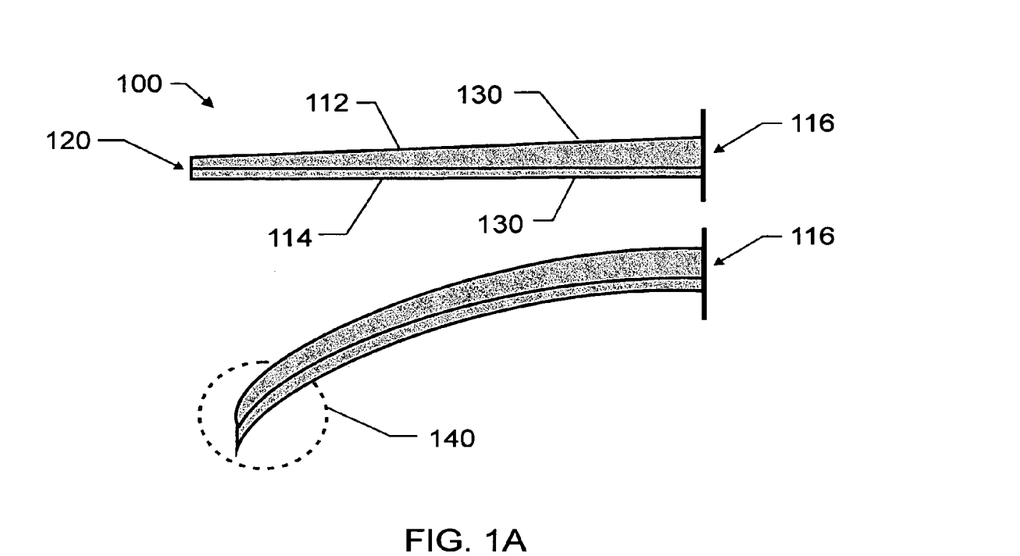
FIG. 1A illustrates a side view of an embodiment of a non-uniform thickness actuator, showing the most responsive portions located at the thinnest points of the active layer closer to the free end.
Figure 1B:
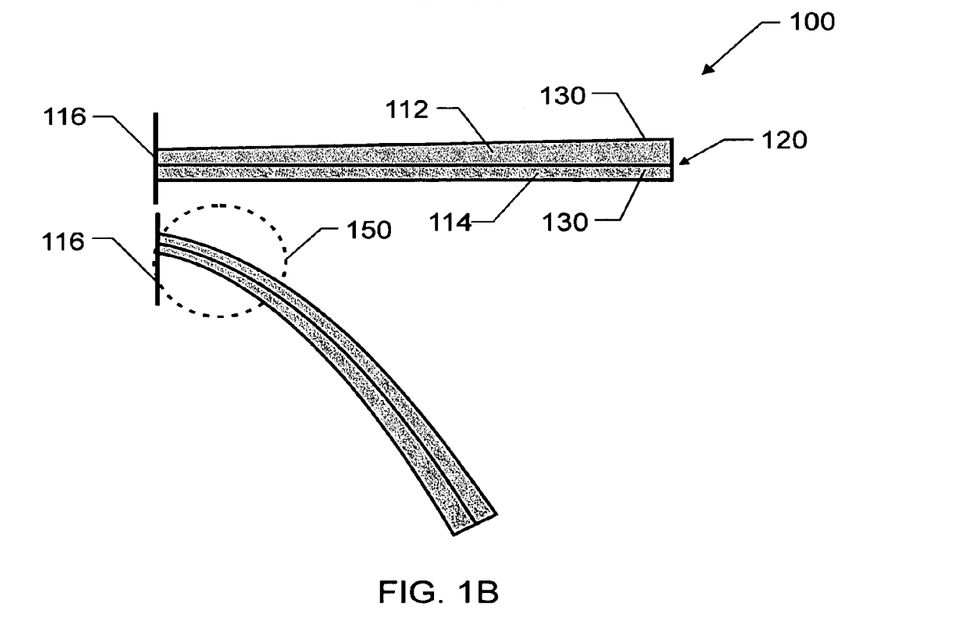
FIG. 1B illustrates a side view of an embodiment of a non-uniform thickness actuator, showing the most responsive portions located at the thinnest points of the active layer closer to the cantilevered end.

Referring now to the drawings, and more particularly to FIGS. 1A and 1B, an electroactive device according to the present invention is shown and referenced generally by the numeral 100. Electroactive layer 112 is of non-uniform thickness and is bonded to non-electroactive layer 114, which has uniform thickness. A layer should be understood to be a sheet, strip, film, plate, or the like, which may have various configurations such as planar, annular, and spiral. Although either or both layers can be of nonuniform thickness, nonuniformity of the electroactive layer thickness will produce the greatest strain, and hence displacement capability of the device. Electroactive layer 112 can be any material that responds to electrical activation, including a polymer, ceramic or composite, and is selected based upon the response desired. A preferred material is the electrostrictive graft elastomer described and claimed in "Electrostrictive Graft Elastomer", Ser. No. 09/696,527, filed Oct. 23, 2000, hereby incorporated by reference. Another preferred embodiment is the polymer-polymer actuator described and claimed in "Polymer-Polymer Bilayer Actuator", Ser. No. 09/696,524, filed Oct. 23, 2000, also hereby incorporated by reference, wherein the active polymeric web has non-uniform thickness. Non-electroactive layer 114 must have a mechanical modulus sufficient to obtain the desired response in conjunction with electroactive layer 112. For equal thickness of the electroactive layer 112 and non-electroactive layer 114, the mechanical modulus of the non-electroactive layer 114 is preferred to be equal to or lower than the mechanical modulus of the electroactive layer 112 in order to achieve maximum bending displacement. Candidate materials include polymers, ceramics, composites, and metals.

The layers 112 and 114 are bonded using chemical, physical, mechanical, or biological bonding means. The preferred bonding means provide ease in processing, minimized thickness, as well as the desired stiffness and durability. Especially preferred is a chemical adhesive that is cast and cured at room temperature. The bonding layer thickness depends on the whole configuration of the device, including the material selections for the electroactive and non-electroactive layers, as well as the device's displacement and stress induced at the bonding interfaces. The thinnest bonding layer that satisfies the device requirements is preferred. Epoxy resin is a suitable chemical adhesive.

Layers 112 and 114 are fixedly mounted at 116 and electrically connected to a drive voltage (not shown). When no voltage is supplied, the device remains in the non-activated position 120. In FIG. 1A, when voltage is supplied, electrical signals are supplied across the thickness of layer 112, and the electroactive response of layer 112 causes device 100 to bend to position 140. The electrical signals are supplied via one or more electrodes 130 disposed on each of the upper and lower surfaces of layer 112. These electrodes 130 can be disposed via a single layer across the surface or via multiple or patterned electrodes, depending on the desired response. One example of suitable electrodes 130 are gold electrodes, although any material having significant conductivity (generally greater than $10^5$ S/m) and fatigue resistance can be used. A conductive polymer having mechanical elasticity comparable to the electroactive material and good adherence to the electroactive material is preferred for the electrode material. Some examples of suitable electrodes are polypyrrole and polyaniline. The drive voltage is dependent on the number of device layers, as well as on the desired displacement, and can range from several volts to several kV.

The most responsive area of device 100 is position 140 at the thinnest portion of electroactive layer 112. Similarly, in FIG. 1B, the most responsive area of device 100 is position 150, at the the thinnest portion of electroactive layer 112. In other embodiments the non-electroactive layer 114 may be of non-uniform thickness, although lesser displacement of the device would be achieved.

The thickness ratio between electroactive layer 112 and non-electroactive layer 114 can be tailored to achieve the desired response. If the electroactive and non-electroactive layers have the same mechanical modulus, then the non-electroactive layer thickness should be less than or equal to that of the electroactive layer thickness. If the moduli differ, the thicknesses are optimized based on the application requirements. The thickness of the layers 112 and 114 depend upon the desired response. For multiple electroactive layers, the thicknesses of the layers, the moduli of the layers, and the material selection is tailored to achieve desired results.

Figure 2A:
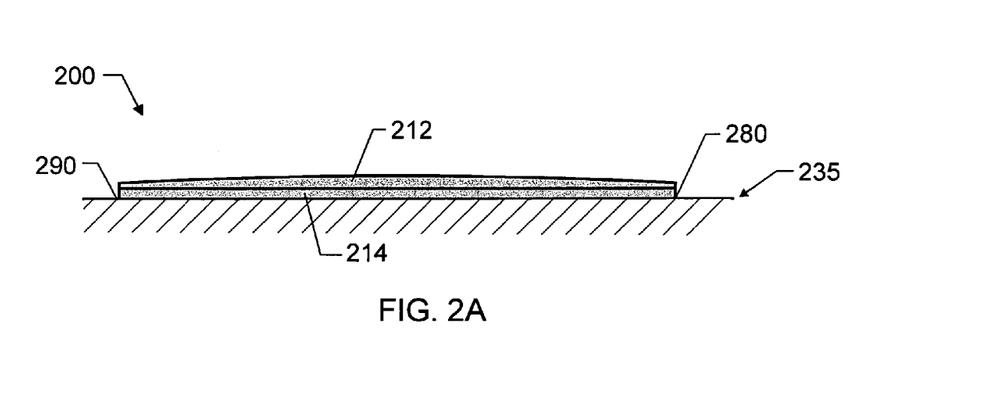
FIG. 2 illustrates a side view of a non-uniform thickness actuator fixed at one end, with the thickness of the active layer decreasing towards the fixed ends.
Figure 2B:
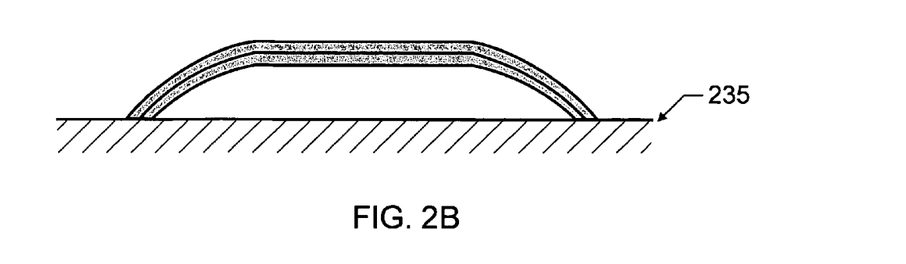

Referring to FIGS. 2A and 2B, another embodiment of the electroactive device according to the present invention is shown and referenced generally by the numeral 200. Electroactive layer 212 is narrowed at each end and is bonded along its length to non-electroactive layer 214, which has uniform thickness. Device 200 is fixedly attached at 280 to a structure 235 on which the actuator acts. Furthermore, device 200 can be attached to the support layer 235 by chemical or mechanical means. Electroactive layer 212 is electrically connected to a drive voltage (not shown). When no voltage is supplied, as illustrated in FIG. 2A, the device 200 remains in its non-activated position. When voltage is supplied, as illustrated in FIG. 2B, the electroactive response of layer 212 causes device 200 to bend to its activated position. The most responsive areas of the device 200 are at the thinnest portions of layer 212, nearest ends 280 and 290.

Figure 3A:
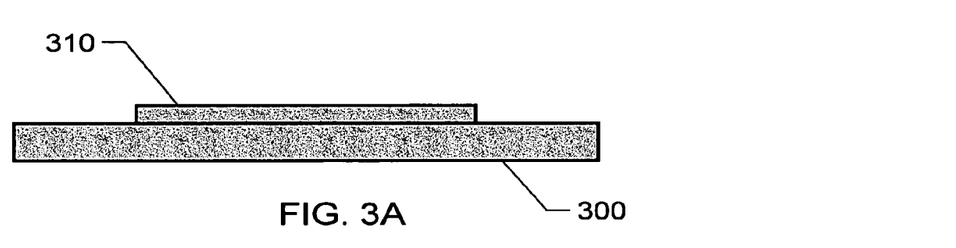
FIGS. 3A–3C illustrate a cross section of a typical hydrofoil or airfoil with a non-uniform thickness actuator, in actuated and non-actuated configurations, attached to the surface of the foil.
Figure 3B:
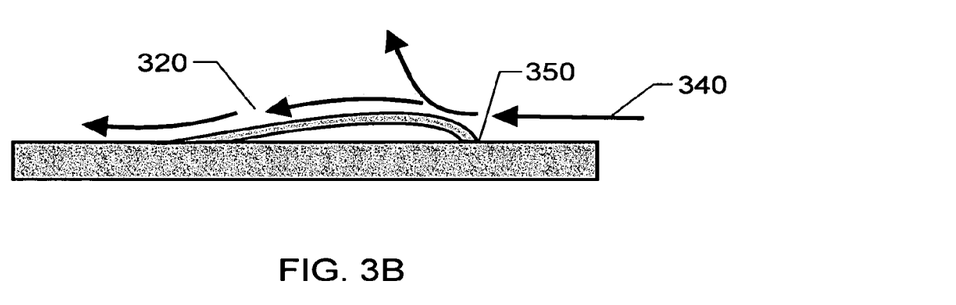
Figure 3C:
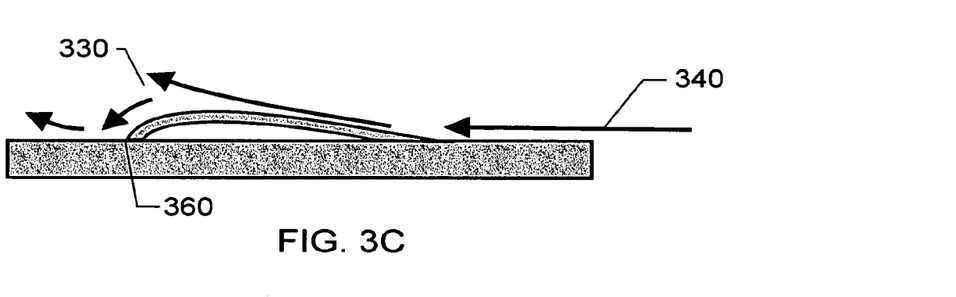
Figure 3D:
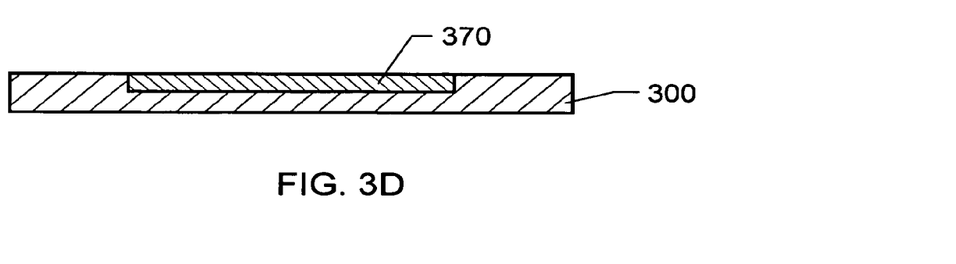
FIG. 3D illustrates a cross section of a typical hydrofoil or airfoil with a non-uniform thickness actuator integrated into the foil.

FIGS. 3A through 3C depict an application in which a non-uniform electroactive device is used to optimize characteristics of a hydrofoil or airfoil. Such optimization may include the formation of traveling waves. Cross-Section 300 represents a typical airfoil or hydrofoil. One or more non-uniform thickness electroactive actuators 310 are affixed to the airfoil or hydrofoil, preferably at the leading edge. In the activated positions 320 and 330, the actuators form a curvature that alters the flow stream 340. FIG. 3B illustrates the actuator displacement resulting from the actuator being fixed at 350 to the airfoil or hydrofoil. FIG. 3C illustrates an actuator displacement resulting from the actuator being fixed at 360 to the airfoil or hydrofoil. In another embodiment, shown in FIG. 3D, one or more electroactive devices 370 are integrated into the airfoil or hydrofoil; i.e., attached to and recessed within the hydrofoil or airfoil 300. Again, the electroactive devices are affixed at one end to the airfoil or hydrofoil. This embodiment results in a smooth airfoil/hydrofoil surface when the electroactive device(s) 370 are in their inactivated state.

Figure 4:
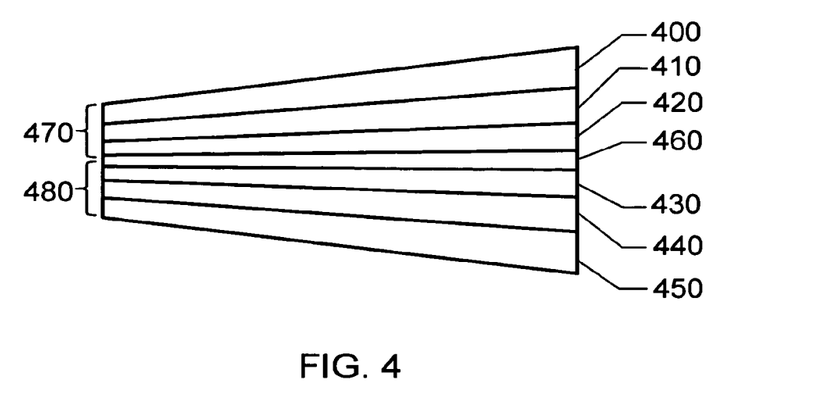
FIG. 4 illustrates an embodiment of a non-uniform thickness actuator having stacked electroactive layers, wherein the stacks on either side of the bond interface are alternately activated.

FIG. 4 illustrates an embodiment having multiple electroactive layers 400 through 450. Electroactive layers 400 through 420 form a first stack 470 and electroactive layers 430 through 450 form a second stack 480. The first stack 470 and second stack 480 are bonded via bonding layer 460. First stack 470 and second stack 480 are alternately activated. Although electroactive layers 400 through 450 can be different materials, consistent materials are preferred to obtain greater control of the device.

Figure 5:
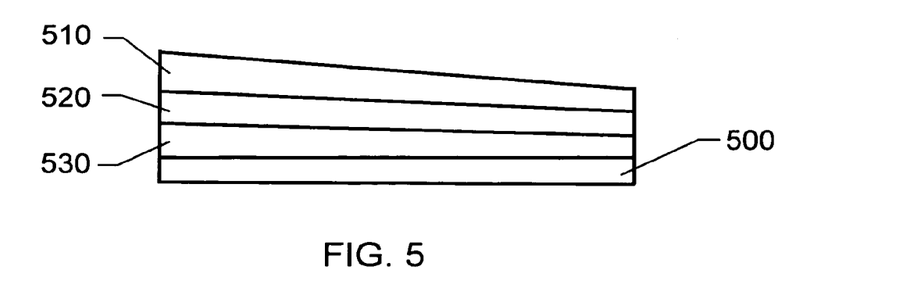
FIG. 5 illustrates an embodiment of a non-uniform thickness actuator having multiple electroactive layers.

FIG. 5 illustrates an embodiment having three electroactive layers 510 through 530 and a single non-electroactive layer 500. Such a multiple electroactive layer arrangement may be used to obtain greater output force and greater strain/displacement for a given drive voltage.

Figure 6:
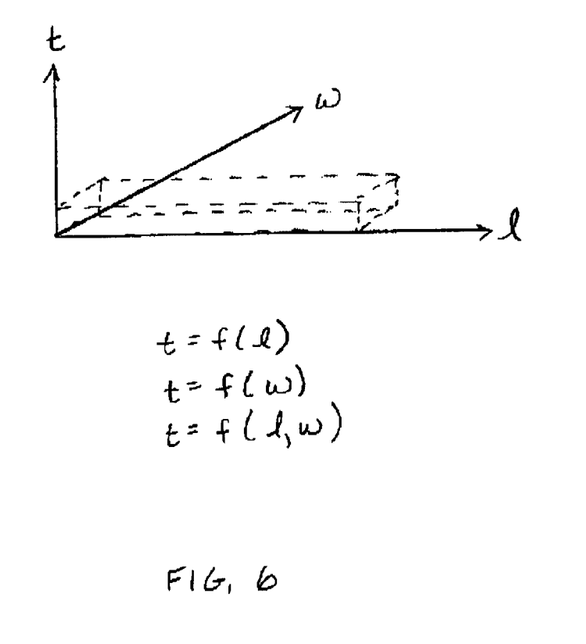
FIG. 6 illustrates thickness variation of a single layer of an actuator.

Referring now to FIG. 6, the thickness variation of one or more layers is chosen to achieve a desired contour. The thickness of a layer can vary as any function of length (t=f(l)), any function of width (t=f(w)), or as any function of both length and width (t=f(l,w)). This thickness variation acts in cooperation with and/or enhances the contour that could be achieved by material choice, electrode design, or orientation of layers.

Although the drawings illustrate specific configurations, the invention is not limited to such specific configurations. At least one electroactive layer is required and at least one non-uniform thickness layer (electroactive or non-electroactive) is required, but each desired application and its associated desired response (strain and force) will dictate the number of electroactive layers and number of nonuniform layers needed. A non-electroactive layer is not required, such as the embodiment shown in FIG. 4 illustrates; however, if a non-electroactive layer is used, there should be no more than one. As provided earlier, such non-electroactive layer may be of uniform or non-uniform thickness depending on the desired results. Although the embodiments shown illustrate the electroactive devices being fixed at an end, they may be fixed to another location as desired for a specific application. For example, the electroactive device itself could be the membrane to be deformed, such as a reflector, and have a centrally fixed point.

Factors which affect the performance of the present invention include: 1) the non-uniformity in layer thicknesses; 2) electromechanical properties of the electroactive layer, such as electric field induced strain, mechanical modulus, and electromechanical conversion efficiency, as well as output energy/energy density; 3) mechanical properties of the non-electroactive layer, such as mechanical modulus; 4) bonding between the layers, as well as 5) the geometric dimension of each component. For an optimized configuration; 1) the electroactive layer(s) offer maximized electric field induced strain and maximized mechanical modulus, therefore, maximized electromechanical output power/energy; 2) the non-electroactive layer offers mechanical modulus not higher than that of the electroactive layer(s); 3) the bonding between layers offers strength, does not allow any significant sliding effect between the electroactive and non-electroactive layers in the direction parallel to the surfaces, and offers maximized durability under working conditions; 4) the relative dimensions of the electroactive layer(s) and non-electroactive layer are chosen according to the requirements of a particular application, with a relatively thin non-electroactive layer being preferred; 5) the thickness of the bonding material is minimized; and 6) the non-uniform thicknesses of layers are designed to meet desired response requirements.

Obviously, numerous additional modifications and variations of the present invention are possible in light of above teachings. It is therefore to be understood that within the scope of the appended claims, the invention may be practiced otherwise than is specifically described herein.

What is claimed is:

1. An electroactive device, comprising:
   at least two layers of material, each layer having a length, width and thickness dimension, wherein at least one layer is an electroactive material and wherein at least one layer of electroactive material is of non-uniform thickness, further wherein the thickness of each non-uniform thickness layer varies along one or more of the non-uniform thickness layer's length and width; and
   means for bonding the layers to one another.

2. The electroactive device of claim 1, wherein the at least one layer of electroactive material further comprises means to supply electrical signals across the thickness thereof.

3. The electroactive device of claim 2, when the means to supply electrical signals is at least one electrode positioned on each of the upper and lower surfaces of the at least one layer of electroactive material.

4. The electroactive device of claim 3, wherein the at least one electrode is a conductive polymer material having elasticity comparable to the at least one layer of electroactive material and having good adherence to the at least one electroactive material.

5. The electroactive device of claim 2, wherein the applied amplitude of the electrical signals controls the range of device motion.

6. The electroactive device of claim 1, wherein non-uniform thickness of at least one layer enables a controlled contouring of the activated device.

7. The electroactive device of claim 6, wherein the controlled contouring comprises bending of the activated device.

8. The electroactive device of claim 6, wherein the controlled contouring comprises torsion of the activated device.

9. The electroactive device of claim 1, wherein the non-uniform thickness of at least one electroactive layer is a function of at least one dimension of the layer.

10. An electroactive device, comprising:
at least two layers of material, each layer having a length, width and thickness dimension, wherein at least one layer is an electroactive material and wherein at least one layer is of non-uniform thickness, and
means for bonding the layers to one another;
wherein the non-uniform thickness of at least one layer is a function of both the length and width of the layer.

11. The electroactive device of claim 1, wherein two or more layers of material are electroactive.

12. The electroactive device of claim 1, wherein one layer of material is non-electroactive.

13. The electroactive device of claim 12, wherein the non-electroactive material is selected from the group consisting of polymers, ceramics, composites and metals.

14. The electroactive device of claim 1, wherein the electroactive material is a material that responds to electrical activation.

15. The electroactive device of claim 1, wherein the electroactive material is selected from the group consisting of polymers, ceramics, and composites.

16. An electroactive device, comprising:
at least two layers of material, each layer having a length, width and thickness dimension, wherein at least one layer is an electroactive material and wherein at least one layer is of non-uniform thickness; and
means for bonding the layers to one another;
wherein the electroactive material is an electrostrictive graft elastomer comprising a backbone molecule which is a non-crystallizable, flexible macromolecular chain, and a grafted polymer forming polar graft moieties with backbone molecules, the polar graft moieties laving been rotated by an applied electric field and sustained in the rotated state until the electric field is removed.

17. The electroactive device of claim 1, wherein the cross-section of at least one non-uniform thickness electroactive layer is defined by a function of the distance along the length of the layer.

18. An electroactive device, comprising:
at least two layers of material, each layer having a length, width and thickness dimension, wherein at least one layer is an electroactive material and wherein at least one layer is of non-uniform thickess; and
means for bonding the layers to one another;
wherein the cross-section of at least one non-uniform layer is defined by a function of the distance along the width of the layer.

19. An electroactive device, comprising:
at least two layers of material, each layer having a length, width and thickness dimension, wherein at least one layer is an electroactive material and wherein at least one layer is of non-uniform thickness; and
means for bonding the layers to one another;
wherein the cross-section of at least one non-uniform layer is defined by a function of both the distance along the length of the layer and the distance along the width of the layer.

20. The electroactive device of claim 1, wherein the layers of the device are conformable for use in folded deployable devices.

21. The electroactive device of claim 1, wherein the means for bonding the layers is selected from the group consisting of chemical bonding, physical bonding, mechanical bonding, and biological bonding.

22. An electroactive device as claimed in claim 1, wherein the means for bonding the layers is a chemical bonding means employing a chemical adhesive.

23. The electroactive device of claim 1, wherein the device itself is a membrane to be deformed.

24. The electroactive device of claim 23, wherein the membrane is a reflector.

25. The electroactive device of claim 1, wherein at least one device is positioned along the surface of a structure to modify the surface's contour.

26. The electroactive device of claim 25, wherein, the surface to be modified is a skin surface.

27. The electroactive device of claim 26, wherein the device produces traveling waves.

28. The electroactive device of claim 25, wherein the surface to be modified is a display panel.

29. The electroactive device of claim 25, wherein the surface to be modified is an optical index layer for a liquid crystal display.

30. The electroactive device of claim 1, wherein at least one device is integrated within the surface of a structure to modify the surface's contour.

31. The electroactive device of claim 30, wherein the surface to be modified is a skin surface.

32. The electroactive device of claim 30, wherein the device produces traveling waves.

33. The electroactive device of claim 1, wherein the device performs at least one lotion selected from the group consisting of shaping, tuning, positioning, controlling and deforming.

34. The electroactive device of claim 1, wherein the device is a component of a micro-electromechanical system.

35. The electroactive device of claim 1, wherein the device is a component of a nano-electromechanical system.

* * * * *